United States Patent
Horii et al.

(10) Patent No.: US 8,901,698 B2
(45) Date of Patent: Dec. 2, 2014

(54) SCHOTTKY BARRIER DIODE AND METHOD FOR MANUFACTURING SCHOTTKY BARRIER DIODE

(71) Applicant: Sumitomo Electric Industries, Ltd., Osaka (JP)

(72) Inventors: Taku Horii, Osaka (JP); Tomihito Miyazaki, Osaka (JP); Makoto Kiyama, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/935,344

(22) Filed: Jul. 3, 2013

(65) Prior Publication Data
US 2013/0292695 A1  Nov. 7, 2013

Related U.S. Application Data

(63) Continuation of application No. 13/057,241, filed as application No. PCT/JP2009/063149 on Jul. 23, 2009, now Pat. No. 8,502,337.

(30) Foreign Application Priority Data

Aug. 5, 2008  (JP) .................................. 2008-201998

(51) Int. Cl.
*H01L 29/20* (2006.01)
*H01L 21/283* (2006.01)
*H01L 29/872* (2006.01)
*H01L 29/47* (2006.01)
*H01L 29/06* (2006.01)
*H01L 29/08* (2006.01)
*H01L 29/66* (2006.01)
*H01L 29/40* (2006.01)

(52) U.S. Cl.
CPC ............ *H01L 29/872* (2013.01); *H01L 29/475* (2013.01); *H01L 29/402* (2013.01); *H01L 29/2003* (2013.01); *H01L 29/0611* (2013.01); *H01L 29/08* (2013.01); *H01L 29/66143* (2013.01)

USPC ................... 257/473; 257/472; 257/E29.089; 257/E21.159; 438/572

(58) Field of Classification Search
USPC ............ 257/472, E29.089, E21.159; 438/572
See application file for complete search history.

(56) References Cited

U.S. PATENT DOCUMENTS 7,531,889 B2 * 5/2009 Kiyama et al. ................. 257/615
7,763,892 B2 * 7/2010 Miura et al. ..................... 257/76

(Continued)

FOREIGN PATENT DOCUMENTS

CN      1993834 A    7/2007
EP    1 633 003 A2    3/2006

(Continued)

OTHER PUBLICATIONS

Liu et al., "Ni and Ni silicide Schottky contacts on n-GaN," Journal of Applied Physics, vol. 84, No. 2, pp. 881-886 (1998).

(Continued)

*Primary Examiner* — Victor A Mandala
(74) *Attorney, Agent, or Firm* — Venable LLP; Michael A. Sartori; Tamatane J. Aga

(57) ABSTRACT

A method for manufacturing a Schottky barrier diode includes the following steps. First, a GaN substrate is prepared. A GaN layer is formed on the GaN substrate. A Schottky electrode including a first layer made of Ni or Ni alloy and in contact with the GaN layer is formed. The step of forming the Schottky electrode includes a step of forming a metal layer to serve as the Schottky electrode and a step of heat treating the metal layer. A region of the GaN layer in contact with the Schottky electrode has a dislocation density of $1 \times 10^8$ $cm^{-2}$ or less.

14 Claims, 7 Drawing Sheets

(56) References Cited

U.S. PATENT DOCUMENTS

| | | | |
|---|---|---|---|
| 8,212,259 B2 * | 7/2012 | Flynn et al. | 257/76 |
| 8,258,051 B2 * | 9/2012 | Mizuhara et al. | 438/503 |
| 2006/0046331 A1 | 3/2006 | Kiyama et al. | |
| 2006/0197175 A1 | 9/2006 | Yanagihara et al. | |
| 2008/0272377 A1 * | 11/2008 | Nakahata | 257/76 |
| 2008/0315209 A1 * | 12/2008 | Miura et al. | 257/76 |
| 2009/0194847 A1 * | 8/2009 | Fujiwara et al. | 257/615 |
| 2009/0236694 A1 * | 9/2009 | Mizuhara et al. | 257/615 |
| 2010/0044718 A1 * | 2/2010 | Hanser et al. | 257/76 |
| 2010/0207138 A1 * | 8/2010 | Nakahata et al. | 257/94 |
| 2010/0289122 A1 * | 11/2010 | Vaudo et al. | 257/615 |

FOREIGN PATENT DOCUMENTS

| | | |
|---|---|---|
| EP | 1 876 649 A1 | 1/2008 |
| EP | 2 184 782 A1 | 5/2010 |
| JP | 61-285763 A | 12/1986 |
| JP | 06-104424 A | 4/1994 |
| JP | 2002-141499 A | 5/2002 |
| JP | 2004-087587 A | 3/2004 |
| JP | 2006-100801 A | 4/2006 |
| JP | 2006-279032 A | 10/2006 |
| JP | 2006-310408 A | 11/2006 |
| JP | 2008-130927 A | 6/2008 |
| TW | 200612495 | 4/2006 |

OTHER PUBLICATIONS

Hai Lu et al., "Schottky rectifiers fabricated on bulk GaN substrate analyzed by electron-beam induced current technique," Solid-State Electronics, vol. 52, No. 5 (2008), pp. 817-823.

N. Miura et al., "Thermal annealing effects on Ni/Au based Schottky contacts on n-GaN and AlGaN/GaN with insertion of high work function metal," Solid-State Electronics, vol. 48, No. 5 (2004) pp. 689-695.

Extended European Search Report in European Patent Application No. 09804875.4, dated Jan. 3, 2014.

Office Action in Taiwanese Patent Application No. 098125575, dated Jan. 3, 2014.

Ip et al., "High current bulk GaN Schottky rectifiers," Solid-State Electronics, Elsevier Science Publishers, Barking, GB, vol. 46, No. 12, Dec. 2002, pp. 2169-2172.

Choi et al., "Tapered Sidewall Schottky Diodes with Very Low Taper Angles," Japanese Journal of Applied Physics, Japan Society of Applied Physics, vol. 22, Supplement 22-1, Aug. 1982, pp. 137-140.

Office Action in European Patent Application No. 09 804 875.4, dated May 27, 2014.

* cited by examiner

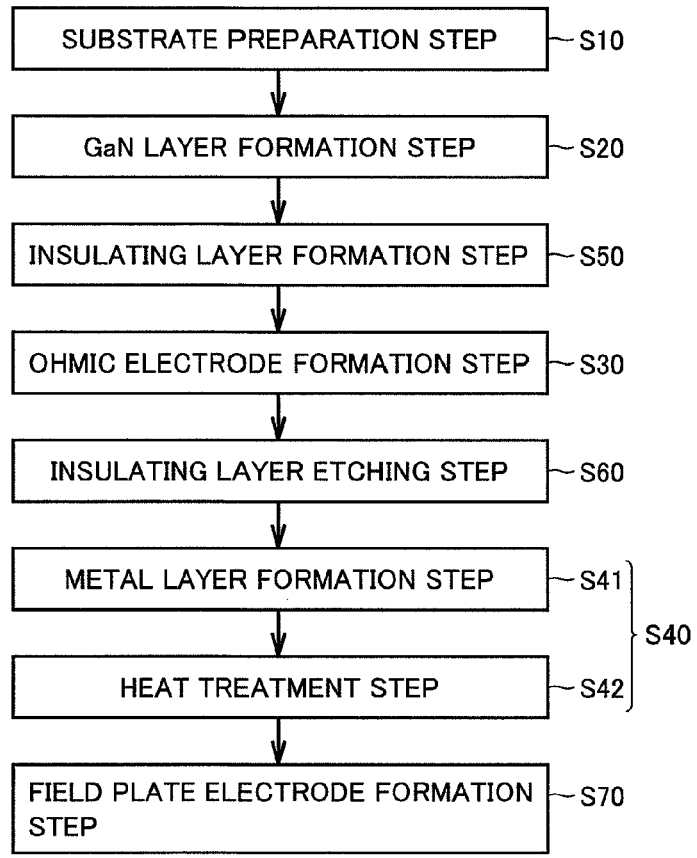
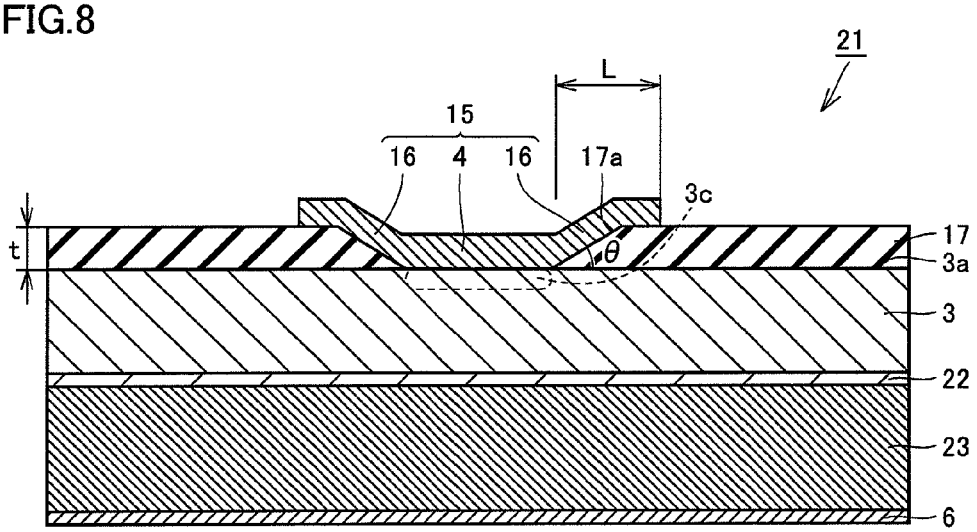

SCHOTTKY BARRIER DIODE AND METHOD FOR MANUFACTURING SCHOTTKY BARRIER DIODE

CROSS-REFERENCE TO RELATED APPLICATION

This application is a Continuation of U.S. patent application Ser. No. 13/057,241, filed Feb. 2, 2011 now U.S. Pat. No. 8,502,337, which is a National Stage Application of International Patent Application No. PCT/JP2009/063149, filed Jul. 23, 2009, and which claims the benefit of Japanese Patent Application No. 2008-201998, filed Aug. 5, 2008, all of which are incorporated herein by reference in their entirety.

TECHNICAL FIELD

The present invention relates to a Schottky barrier diode and a method for manufacturing a Schottky barrier diode. For example, the present invention relates to a Schottky barrier diode having an enhanced withstand voltage, and a method for manufacturing the Schottky barrier diode.

BACKGROUND ART

Gallium nitride (GaN) has various excellent properties such as a bandgap that is about three times as large as that of silicon (Si), a breakdown electric field intensity that is about ten times as high as that of silicon (Si), and further, higher saturation electron velocity than that of silicon (Si). As for GaN, achievement of both high withstand voltage that is difficult in conventional Si power devices and low loss, that is, low on-resistance can be expected, and thus, the application of GaN to a power device (power semiconductor element) such as a Schottky barrier diode (SBD) is expected.

As such Schottky barrier diode, a Schottky barrier diode including a sapphire substrate, a buffer layer formed on this sapphire substrate, an undoped GaN layer formed on this buffer layer, an n-type GaN layer formed on this undoped GaN layer, and a Schottky electrode made of nickel (Ni) or nickel silicide (NiSi) and formed on this n-type GaN layer is disclosed (for example, Non-Patent Document 1). This Non-Patent Document 1 discloses that the barrier height becomes high as a result of heat treatment of the Schottky electrode.

PRIOR ART DOCUMENTS

Patent Documents

Non-Patent Document 1: Q. Z. Liu, L. S. Yu, et al., "Ni and Ni silicide Schottky contacts on n-GaN", JOURNAL OF APPLIED PHYSICS VOLUME 84, NUMBER 2, 15 July 1998, pp. 881-886

SUMMARY OF THE INVENTION

Problems to be Solved by the Invention

In the foregoing Non-Patent Document 1, however, the n-type GaN layer is formed on the sapphire substrate. Since sapphire has a lattice constant and a dislocation density different from those of GaN, the GaN layer formed on the sapphire substrate has poor crystallinity generally. In addition, the foregoing Non-Patent Document 1 does not disclose a technique for enhancing the crystallinity of the n-type GaN layer. Therefore, there has been a problem that the withstand voltage of the Schottky barrier diode cannot be enhanced sufficiently because the n-type GaN layer disclosed in the foregoing Non-Patent Document 1 has poor crystallinity.

The present invention has been made in light of the above problems, and an object of the present invention is to provide a Schottky barrier diode whose withstand voltage can be enhanced, and a method for manufacturing the Schottky barrier diode.

Means for Solving the Problems

The inventors of the present invention have found, as a result of their earnest study, that the reason why the withstand voltage of the Schottky barrier diode in the foregoing Non-Patent Document 1 cannot be enhanced is due to high dislocation density of the GaN layer in contact with the Schottky electrode. In other words, when the GaN layer has a high dislocation density, the reverse leak current increases even if the barrier height of the Schottky electrode increases. The inventors of the present invention also have found, as a result of their earnest study, that an increase in reverse leak current caused by the dislocation density of the GaN layer in contact with the Schottky electrode has a great influence on the withstand voltage of the Schottky barrier diode. As a result, even if the barrier height of the Schottky electrode increases as in the foregoing Non-Patent Document 1, the withstand voltage of the Schottky barrier diode cannot be sufficiently enhanced due to this reverse leak current.

Thus, a Schottky barrier diode in one aspect of the present invention includes a GaN substrate, a GaN layer formed on this GaN substrate, and a Schottky electrode formed on this GaN layer. The Schottky electrode includes a first layer made of Ni or Ni alloy and formed at a position where the first layer is in contact with the GaN layer.

In addition, according to a method for manufacturing a Schottky barrier diode in one aspect of the present invention, the method includes the following steps. First, a GaN substrate is prepared. A GaN layer is formed on the GaN substrate. A Schottky electrode including a first layer made of Ni or Ni alloy and in contact with the GaN layer is formed. The step of forming a Schottky electrode includes a step of forming a metal layer to serve as the Schottky electrode, and a step of heat treating the metal layer to form the metal layer into the Schottky electrode including the first layer.

According to the Schottky barrier diode and the method for manufacturing a Schottky barrier diode in one aspect of the present invention, the GaN layer is formed on the GaN substrate. Since the underlying substrate and the grown layer have the same composition, the dislocation density of the GaN layer can be reduced. Therefore, the reverse leak current can be decreased when the Schottky barrier diode is reversely biased.

In addition, the inventors of the present invention have found that the Schottky electrode whose barrier height can be effectively increased as a result of heat treatment is made of Ni or Ni alloy. Therefore, by forming Ni or Ni alloy at a position where the Schottky electrode is in contact with the GaN layer, the barrier height of the Schottky electrode can be effectively increased.

Accordingly, since the reverse leak current caused by dislocation is small when the Schottky barrier diode is reversely biased, the withstand voltage of the Schottky barrier diode can be enhanced due to an increase in barrier height of the Schottky electrode.

Preferably, in the Schottky barrier diode in one aspect as described above, a region of the GaN layer in contact with the Schottky electrode has a dislocation density of $1 \times 10^8$ cm$^{-2}$ or less.

In addition, preferably, in the method for manufacturing a Schottky barrier diode in one aspect as described above, in the step of preparing a GaN substrate, the GaN substrate having a dislocation density of $1 \times 10^8$ cm$^{-2}$ or less is prepared.

The inventors of the present invention have found, as a result of their earnest study, that by reducing the dislocation density of the region in contact with the Schottky electrode, the reverse leak current can be reduced. The inventors of the present invention also have found, as a result of their earnest study, that when the region in contact with the Schottky electrode has a dislocation density of $1 \times 10^8$ cm$^{-2}$ or less, this effect of reducing the reverse leak current is produced more effectively. Therefore, the withstand voltage of the Schottky barrier diode can be further enhanced.

It is noted that the dislocation density of the GaN substrate serving as the underlying substrate is passed to the GaN layer. Therefore, by setting the dislocation density of the GaN substrate to $1 \times 10^8$ cm$^{-2}$ or less, the dislocation density of the GaN layer formed on the GaN substrate can be set to $1 \times 10^8$ cm$^{-2}$ or less.

A Schottky barrier diode in another aspect of the present invention includes a GaN layer and a Schottky electrode formed on the GaN layer. A region of the GaN layer in contact with the Schottky electrode has a dislocation density of $1 \times 10^8$ cm$^{-2}$ or less. The Schottky electrode includes a first layer made of Ni or Ni alloy and formed at a position where the first layer is in contact with the GaN layer.

A method for manufacturing a Schottky barrier diode in another aspect of the present invention includes the following steps. First, a GaN layer is prepared. A Schottky electrode including a first layer made of Ni or Ni alloy and in contact with the GaN layer is formed. The step of preparing a GaN layer includes a step of preparing the GaN layer whose region in contact with the Schottky electrode has a dislocation density of $1 \times 10^8$ cm$^{-2}$ or less. The step of forming a Schottky electrode includes a step of forming a metal layer to serve as the Schottky electrode and a step of heat treating the metal layer to form the metal layer into the Schottky electrode including the first layer.

As described above, the inventors of the present invention have found that when the region in contact with the Schottky electrode has a dislocation density of $1 \times 10^8$ cm$^{-2}$ or less, the reverse leak current can be significantly reduced. In addition, Ni or Ni alloy that can achieve an increase in barrier height as a result of heat treatment is used as the Schottky electrode. Accordingly, since the reverse leak current caused by dislocation is small when the Schottky barrier diode is reversely biased, the withstand voltage of the Schottky barrier diode can be enhanced due to an increase in barrier height of the Schottky electrode.

Preferably, in the Schottky barrier diode in another aspect as described above, the Schottky barrier diode further includes a GaN substrate in contact with a surface of the GaN layer opposite to a surface in contact with the Schottky electrode.

Preferably, in the method for manufacturing a Schottky barrier diode in another aspect as described above, the method further includes a step of preparing a GaN substrate. In the step of preparing a GaN layer, the GaN layer is epitaxially grown on the GaN substrate.

Since the underlying substrate and the grown layer have the same composition, the dislocation density of the GaN layer can be reduced. Therefore, the reverse leak current can be further reduced when the Schottky barrier diode is reversely biased. Accordingly, the withstand voltage of the Schottky barrier diode can be further enhanced.

Preferably, in the Schottky barrier diode in one and another aspects as described above, the Schottky electrode further includes a second layer including gold (Au) and formed on the first layer.

Preferably, in the method for manufacturing a Schottky barrier diode in one and another aspects as described above, the step of forming a Schottky electrode further includes a step of forming a second layer including Au on the first layer.

Since Au has a low electrical resistance, Au is suitably used for connection and the like to a wiring. Therefore, Au can be suitably used in a device including the Schottky barrier diode.

Preferably, in the Schottky barrier diode in one and another aspects as described above, the Schottky barrier diode further includes an insulating layer formed on the GaN layer and having an opening in which the Schottky electrode is formed, and a field plate electrode formed to connect to the Schottky electrode and to overlap the insulating layer.

Preferably, in the method for manufacturing a Schottky barrier diode in one and another aspects as described above, the method further includes a step of forming an insulating layer having an opening on the GaN layer, and a step of forming a field plate (FP) electrode to connect to the Schottky electrode and to overlap the insulating layer. In the step of forming a metal layer, the metal layer is formed in the opening of the insulating layer to be in contact with the GaN layer.

In the Schottky barrier diode having a field plate structure as described above, the GaN layer of the present invention has a low dislocation density, and thus, the reverse leak current can be decreased. Under this condition, the field plate structure alleviates the electric field. As a result, the reverse leak current can be further decreased and the reverse withstand voltage can be increased.

The field plate structure herein refers to a structure configured by the insulating layer and the field plate electrode formed on this insulating layer. The field plate electrode is electrically connected to the Schottky electrode, and the Schottky electrode and the field plate electrode have the same potential. The field plate structure alleviates the electric field concentration at an end of the Schottky electrode during operation, which leads to device destruction, and allows high withstand voltage and high output of the Schottky barrier diode. The insulating layer can be made of, for example, $SiN_x$.

Preferably, in the method for manufacturing a Schottky barrier diode in one and another aspects as described above, in the step of heat treating the metal layer, the metal layer is heat treated at a temperature of 300° C. or more and 600° C. or less. In addition, more preferably, in the step of heat treating the metal layer, the metal layer is heat treated at a temperature of 400° C. or more and 550° C. or less.

By heat treating the metal layer at a temperature ranging 300° C. or more and 600° C. or less, the barrier height of the Schottky electrode can be effectively increased. By heat treating the metal layer at a temperature ranging 400° C. or more and 550° C. or less, the Schottky barrier height can be increased more effectively. Therefore, the withstand voltage of the Schottky barrier diode can be further enhanced.

Preferably, in the method for manufacturing a Schottky barrier diode in one and another aspects as described above, the step of forming a metal layer and the step of heat treating the metal layer are performed in parallel.

As a result, the metal layer can be heat treated using heat applied when the metal layer is formed. Therefore, energy required to form the Schottky electrode can be reduced. In addition, the Schottky barrier diode can be manufactured with simplified steps.

Preferably, in the method for manufacturing a Schottky barrier diode in one and another aspects as described above, in the step of heat treating the metal layer, the metal layer is heat treated at a temperature of 200° C. or more and 600° C. or less.

When the step of forming a metal layer and the step of heat treating the metal layer are performed in parallel, heat applied when the metal layer is formed can be used, and thus, the Schottky barrier height can be increased even at a low temperature. In other words, by heat treating the metal layer at a temperature ranging 200° C. or more and 600° C. or less, the Schottky barrier height can be effectively increased. Therefore, the withstand voltage of the Schottky barrier diode can be further enhanced.

Preferably, in the method for manufacturing a Schottky barrier diode in one and another aspects as described above, in the step of heat treating the metal layer, the metal layer is heat treated in an atmosphere including nitrogen.

As a result, drop of N (nitrogen) from the GaN layer when heat is applied to the GaN layer can be suppressed. Therefore, even when the heat treatment is performed, creation of a defect such as dislocation caused by drop of N from the GaN layer can be suppressed. Accordingly, an increase in reverse leak current can be suppressed.

Preferably, in the method for manufacturing a Schottky barrier diode in one and another aspects as described above, the method further includes at least one of a step of heat treating the GaN layer and a step of forming an insulating layer on the GaN layer by using a plasma CVD (Chemical Vapor Deposition) method, prior to the step of forming a metal layer.

The inventors of the present invention have found, as a result of their earnest study, that by heat treating the GaN layer and by forming the insulating layer on the GaN layer by using the plasma CVD method, prior to formation of the metal layer, the barrier height of the metal layer that will be subsequently formed can be enhanced. Therefore, the withstand voltage of the Schottky barrier diode can be further enhanced.

Effects of the Invention

According to the Schottky barrier diode and the method for manufacturing a Schottky barrier diode in the present invention, since the reverse leak current caused by dislocation is small when the Schottky barrier diode is reversely biased, the withstand voltage of the Schottky barrier diode can be enhanced due to an increase in barrier height of the Schottky electrode.

BRIEF DESCRIPTION OF THE DRAWINGS

FIG. 7 is a flow chart illustrating a method for manufacturing the Schottky barrier diode in the second embodiment of the present invention in the order of steps.

FIG. 8 is a cross-sectional view schematically illustrating a Schottky barrier diode in a third embodiment of the present invention.

MODES FOR CARRYING OUT THE INVENTION

Figure 1:
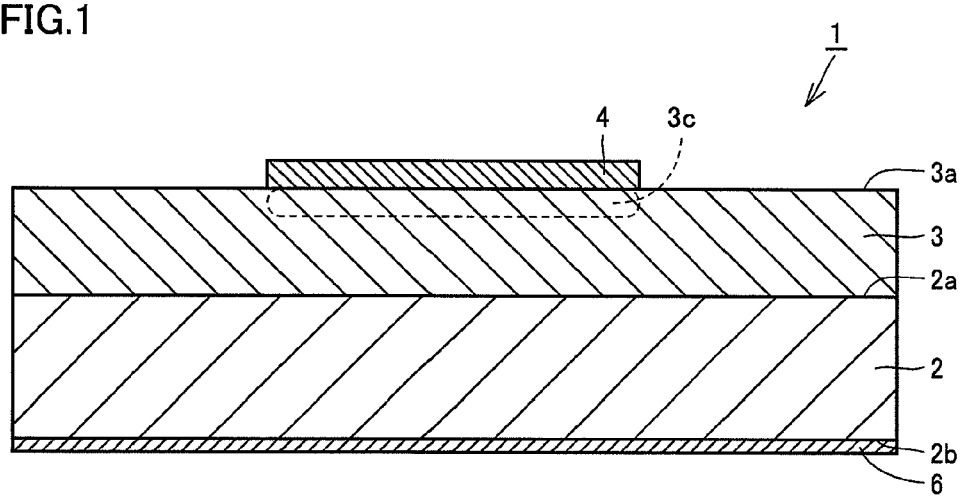
FIG. 1 is a cross-sectional view schematically illustrating a Schottky barrier diode in a first embodiment of the present invention.

Embodiments of the present invention will be described hereinafter based on the drawings. In the following drawings, the same or corresponding components are denoted with the same reference numerals, and description thereof will not be repeated.

First Embodiment

Figure 2:
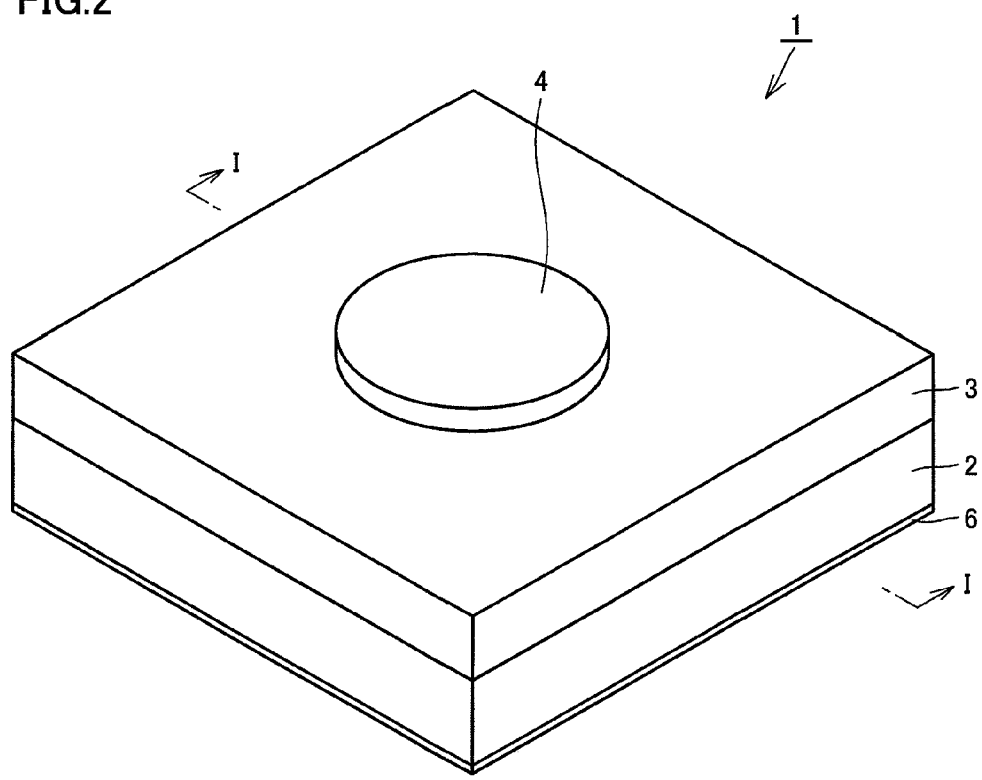
FIG. 2 is a perspective view schematically illustrating the Schottky barrier diode in the first embodiment of the present invention.

FIG. 1 is a cross-sectional view schematically illustrating a Schottky barrier diode in the present embodiment. FIG. 2 is a perspective view schematically illustrating the Schottky barrier diode in the present embodiment. It is noted that FIG. 1 is a cross-sectional view taken along line I-I in FIG. 2. As shown in FIGS. 1 and 2, a Schottky barrier diode (SBD) 1 includes a GaN substrate 2, a GaN layer 3 formed on a front surface 2a of GaN substrate 2, a Schottky electrode 4 formed on this GaN layer 3, and an ohmic electrode 6 formed on a rear surface 2b of GaN substrate 2.

GaN substrate 2 has front surface 2a and rear surface 2b. It is preferable that GaN substrate 2 has lower dislocation density. For example, GaN substrate 2 has a dislocation density of preferably $1 \times 10^8$ cm$^{-2}$ or less, more preferably $1 \times 10^7$ cm$^{-2}$ or less, and even more preferably $1 \times 10^6$ cm$^{-2}$ or less. The dislocation density of GaN layer 3 formed on GaN substrate 2 can also be reduced. Therefore, when GaN substrate 2 has a dislocation density of $1 \times 10^8$ cm$^{-2}$ or less, the dislocation density of GaN layer 3 can be reduced to $1 \times 10^8$ cm$^{-2}$ or less. When GaN substrate 2 has a dislocation density of $1 \times 10^7$ cm$^{-2}$ or less, the dislocation density of GaN layer 3 can be reduced to $1 \times 10^7$ cm$^{-2}$ or less. When GaN substrate 2 has a dislocation density of $1 \times 10^6$ cm$^{-2}$ or less, the dislocation density of GaN layer 3 can be reduced to $1 \times 10^6$ cm$^{-2}$ or less.

It is noted that under present circumstances, a lower limit value of the dislocation density of GaN substrate 2 is, for example, approximately $1 \times 10^3$ cm$^{-2}$.

The dislocation density in the present embodiment can be measured by using, for example, a method of counting the number of pits in molten KOH (potassium hydroxide) created by etching, and dividing the number of pits by unit area.

GaN substrate 2 is, for example, a freestanding substrate and has a thickness of, for example, 100 μm or more. In addition, GaN substrate 2 has a carrier concentration of, for example, approximately $1 \times 10^{16}$ cm$^{-3}$.

It is preferable that a region 3c of GaN layer 3 in contact with Schottky electrode 4 has lower dislocation density. For example, region 3c has a dislocation density of preferably $1 \times 10^8$ cm$^{-2}$ or less, more preferably $1 \times 10^7$ cm$^{-2}$ or less, and even more preferably $1 \times 10^6$ cm$^{-2}$ or less. When this region 3c has a dislocation density of $1 \times 10^8$ cm$^{-2}$ or less, the reverse leak current when Schottky barrier diode 1 is reversely biased can be reduced. When region 3c has a dislocation density of $1\times10^7$ cm$^{-2}$ or less, the reverse leak current can be further reduced. When region 3c has a dislocation density of $1\times10^6$ cm$^{-2}$ or less, the reverse leak current can be even further reduced.

It is noted that under present circumstances, a lower limit value of the dislocation density of GaN layer 3 is, for example, approximately $1\times10^3$ cm$^{-2}$.

GaN layer 3 has a thickness of, for example, approximately 5 μm. Although the conductivity type of GaN layer 3 is not particularly limited, the conductivity type of GaN layer 3 is preferably n-type in terms of easy formation.

Schottky electrode 4 includes a first layer (for example, overall Schottky electrode 4 in FIG. 1, a first layer 4a in FIG. 3) made of Ni or Ni alloy and formed at a position where the first layer is in contact with GaN layer 3. This Schottky electrode 4 forms Schottky junction with GaN layer 3. It is preferable that the first layer of this Schottky electrode 4 has higher barrier height. The first layer of Schottky electrode 4 has a barrier height of, for example, 0.83 eV or more and 1.20 eV or less. The first layer of Schottky electrode 4 has a barrier height of 0.83 eV or more and 0.98 eV or less in terms of easy implementation.

Figure 3:
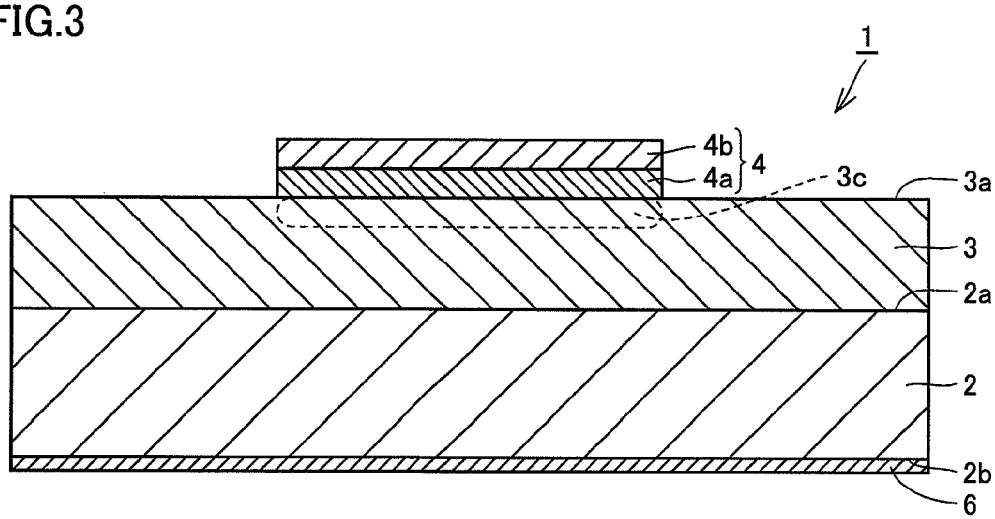
FIG. 3 is a cross-sectional view schematically illustrating another Schottky barrier diode in the first embodiment of the present invention.

FIG. 3 is a cross-sectional view schematically illustrating another Schottky barrier diode in the present embodiment. As shown in FIG. 3, Schottky electrode 4 may include first layer 4a formed at a position where first layer 4a is in contact with GaN layer 3, and a second layer 4b formed on first layer 4a. In this case, first layer 4a is made of Ni or Ni alloy and second layer 4b is made of any metal. Second layer 4b is preferably made of Au. It is noted that Schottky electrode 4 may include one or more additional layers formed on second layer 4b.

Schottky electrode 4 has a circular shape in a plane having a diameter of, for example, approximately 220 μm. In Schottky electrode 4, first layer 4a has a thickness of, for example, 25 nm to 50 nm and second layer 4b has a thickness of, for example, approximately 300 nm.

Ohmic electrode 6 is formed to cover overall rear surface 2b of GaN substrate 2. This ohmic electrode 6 is made of, for example, any of Ti (titanium), Al (aluminum), Au and the like, or two or more of these materials. Ohmic electrode 6 has a thickness of, for example, approximately 100 nm to 340 nm.

In addition, Schottky barrier diode 1 has a vertical structure in which a current flows from one of Schottky electrode 4 and ohmic electrode 6 to the other. Generally, as for a power device, a larger current can flow in the vertical structure than in a horizontal structure, and thus, the vertical structure is more suitable for the power device. Since GaN substrate 2 and GaN layer 3 are conductive in Schottky barrier diode 1, the vertical structure in which ohmic electrode 6 is formed on the rear surface side is possible.

Although ohmic electrode 6 is formed as an electrode on the rear surface 2b side of GaN substrate 2 in the present embodiment, the electrode is not particularly limited thereto. A Schottky electrode and the like may be formed.

Figure 4:
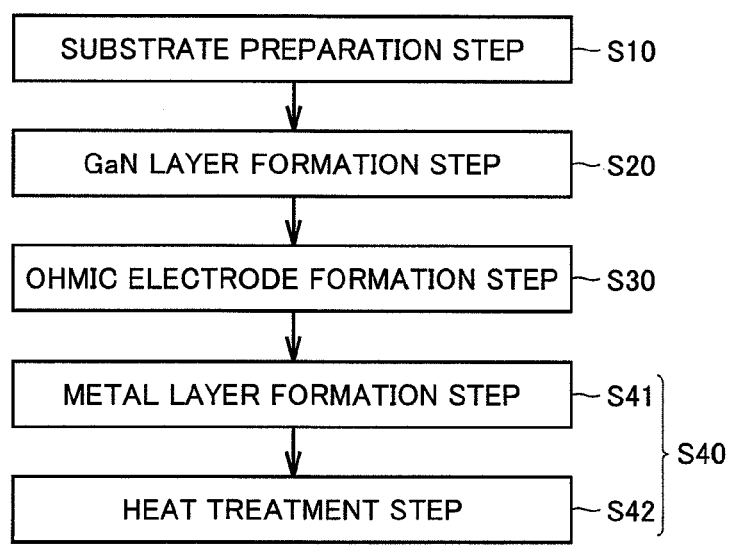
FIG. 4 is a flow chart illustrating a method for manufacturing the Schottky barrier diode in the first embodiment of the present invention in the order of steps.

Description of a method for manufacturing the Schottky barrier diode in the present embodiment will follow with reference to FIG. 4. It is noted that FIG. 4 is a flow chart illustrating the method for manufacturing the Schottky barrier diode in the present embodiment in the order of steps.

Referring to FIG. 4, a substrate preparation step (S10) is first performed. In this substrate preparation step (S10), GaN substrate 2 is prepared. A substrate formed by using any manufacturing method can be used as this GaN substrate 2. For example, GaN substrate 2 having a (0001) face as a main surface and fabricated by using an HVPE (Hydride Vapor Phase Epitaxy) method is prepared. It is preferable that this GaN substrate 2 has lower dislocation density. For example, GaN substrate 2 has a dislocation density of preferably $1\times10^8$ cm$^{-2}$ or less, more preferably $1\times10^7$ cm$^{-2}$ or less, and even more preferably $1\times10^6$ cm$^{-2}$ or less.

Next, a GaN layer formation step (S20) is performed. In this GaN layer formation step (S20), GaN layer 3 is formed on GaN substrate 2.

Specifically, GaN layer 3 is grown on GaN substrate 2 by using an OMVPE (Organo-Metallic Vapor Phase Epitaxy) method. It is preferable that GaN layer 3 grown in such a manner has lower dislocation density. For example, GaN layer 3 has a dislocation density of preferably $1\times10^8$ cm$^{-2}$ or less, more preferably $1\times10^7$ cm$^{-2}$ or less, and even more preferably $1\times10^6$ cm$^{-2}$ or less.

Next, an ohmic electrode formation step (S30) is performed. In the ohmic electrode formation step (S30), ohmic electrode 6 is formed on rear surface 2b of GaN substrate 2.

Specifically, the following steps are performed, for example. First, rear surface 2b of GaN substrate 2 is organically cleaned and cleaned with hydrochloric acid. Thereafter, a metal material such as Ti, Al and Au is formed on overall rear surface 2b by using, for example, an EB (Electron Beam) deposition method, a resistance heating deposition method and the like. Thereafter, heat treatment is performed, for example, at 600° C. for about two minutes under the nitrogen atmosphere to alloy the metal material. As a result, ohmic electrode 6 is formed.

In this ohmic electrode formation step (S30), GaN layer 3 is heat treated as a consequence. It is noted that in the step of heat treating GaN layer 3 prior to a step of forming a metal layer, the heat treatment temperature is not limited to the above temperature. The heat treatment temperature can be set to, for example, 400° C. or more and 800° C. or less, and preferably 600° C. or more and 700° C. or less. As a result, the barrier height of the metal layer that will be formed in a metal layer formation step (S41) that will be described below can be enhanced, and thus, the barrier height of Schottky electrode 4 can be enhanced.

Next, a Schottky electrode formation step (S40) is performed. In this Schottky electrode formation step (S40), Schottky electrode 4 including first layer 4a (see FIG. 3) made of Ni or Ni alloy is formed on GaN layer 3 and at a position where first layer 4a is in contact with GaN layer 3.

Specifically, the following steps are performed, for example. A resist having a circular opening (pattern) is formed on a front surface 3a of GaN layer 3 by photolithography. Thereafter, the surface treatment of GaN layer 3 by cleaning with hydrochloric acid is performed at room temperature for three minutes. Then, the metal layer to serve as Schottky electrode 4 is formed (metal layer formation step (S41)). In this metal layer formation step (S41), it is preferable that a first metal layer of Ni or Ni alloy that will serve as the first layer of Schottky electrode 4 is formed and a second metal layer made of Au is formed on this first metal layer. These metal layers can be formed by using any method. For example, the first metal layer can be formed by using the EB method and the like, and the second metal layer can be formed by using the resistance heating deposition method. Thereafter, when the resist is removed, the metal layers formed on the resist are removed (lift-off) simultaneously, and the metal layer to serve as Schottky electrode 4 is formed. This metal layer can be formed to have a circular shape in a plane, for example.

Thereafter, this metal layer is heat treated (heat treatment step (S42)). By performing the heat treatment step (S42), the metal layer becomes Schottky electrode 4 including the first layer. At this time, the barrier height of first layer 4a made of Ni or Ni alloy can be increased, and thus, the barrier height of Schottky electrode 4 becomes high.

In this heat treatment step (S42), the metal layer is heat treated preferably at 300° C. or more and 600° C. or less, and more preferably at 400° C. or more and 550° C. or less. When the metal layer is heat treated at 300° C. or more and 600° C. or less, the barrier height of first layer 4a made of Ni or Ni alloy can be increased. When the metal layer is heat treated at 400° C. or more and 550° C. or less, the barrier height of first layer 4a can be greatly increased. In addition, the barrier height of first layer 4a of Schottky electrode 4 can be increased as a result of short-time heat treatment. It is noted that when the first and second metal layers are formed in the metal layer formation step (S41), the barrier height of Schottky electrode 4 including first and second layers 4a and 4b shown in FIG. 3 may be further increased by heat treatment at the above temperature in the heat treatment step (S42). A material such as gold can be used for the metal layer (second layer 4b) that can increase the barrier height of Schottky electrode 4 as described above.

In addition, in the heat treatment step (S42), the metal layer is preferably heat treated in the atmosphere including nitrogen. Transition of N atoms easily occurs at low energy. Therefore, when heat is applied to GaN layer 3, drop of N from a region on front surface 3a of GaN layer 3 exposed to the atmosphere for this heat treatment occurs easily. When nitrogen is included in the atmosphere for heat treatment, however, drop of N from GaN layer 3 does not occur easily and N desorbed from GaN layer 3 can be refilled. Therefore, drop of N from GaN layer 3 can be suppressed. Thus, even when the heat treatment step (S42) is performed, formation in GaN layer 3 of a defect such as dislocation caused by drop of N can be suppressed. Accordingly, an increase in reverse leak current can be suppressed.

In addition, in the heat treatment step (S42), the metal layer is preferably heat treated in the normal pressure atmosphere. It is noted that the metal layer may be heat treated in the pressurized atmosphere.

In addition, in the step of forming Schottky electrode 4, the metal layer formation step (S41) and the heat treatment step (S42) can be performed in parallel. In this case, in the heat treatment step (S42), the metal layer is preferably heat treated at a temperature of 200° C. or more and 600° C. or less. Specifically, for example, the metal layer is formed on front surface 3a of GaN layer 3 and is heated from rear surface 2b of GaN substrate 2. As a result, the metal layer formed on front surface 3a of GaN layer 3 can be heat treated from rear surface 2b of GaN substrate 2. A method for heating the metal layer from rear surface 2b of GaN substrate 2 is not particularly limited and includes, for example, a method for heating the metal layer by laser light and the like, a method for heating the metal layer by a heating component such as a thermocouple attached to the susceptor at which rear surface 2b of GaN substrate 2 is placed, and the like.

It is noted that at least a part of the metal layer formation step (S41) and the heat treatment step (S42) may only be performed simultaneously.

By performing the above steps (S10 to S40), Schottky barrier diode 1 shown in FIGS. 1 to 3 can be manufactured. Since GaN layer 3 is formed on GaN substrate 2 in this method for manufacturing Schottky barrier diode 1, the dislocation density of GaN layer 3 can be reduced. Therefore, when a reverse voltage is applied to Schottky barrier diode 1, generation of the reverse leak current can be suppressed. In addition, in the Schottky electrode formation step (S40), the first layer made of Ni or Ni alloy is formed to be in contact with GaN layer 3. Therefore, the barrier height of the Schottky electrode can be increased. Accordingly, the leak current caused by dislocation can be suppressed, and the withstand voltage of Schottky barrier diode 1 can be effectively enhanced due to the increase in barrier height of the Schottky electrode.

Second Embodiment

Figure 5:
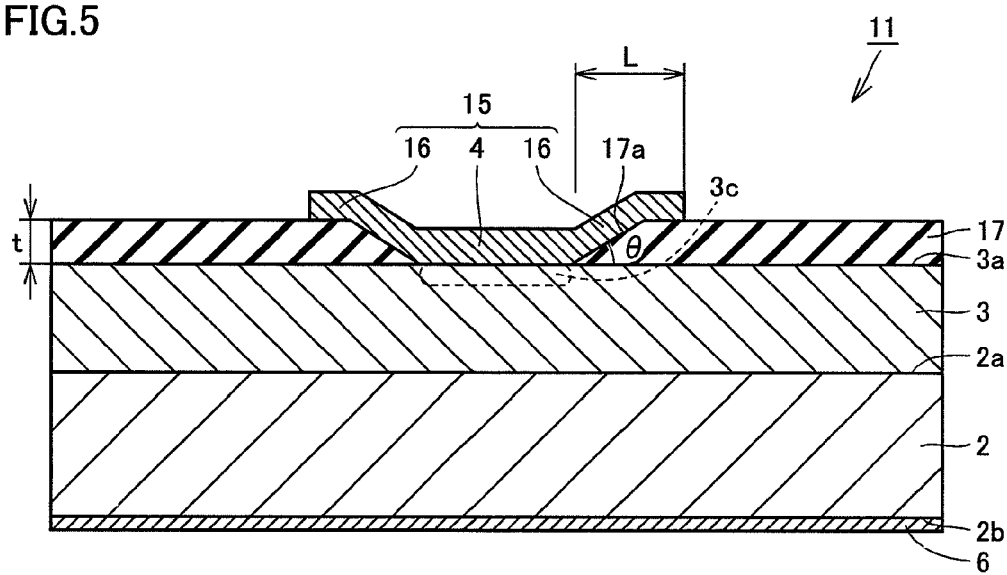
FIG. 5 is a cross-sectional view schematically illustrating a Schottky barrier diode in a second embodiment of the present invention.
Figure 6:
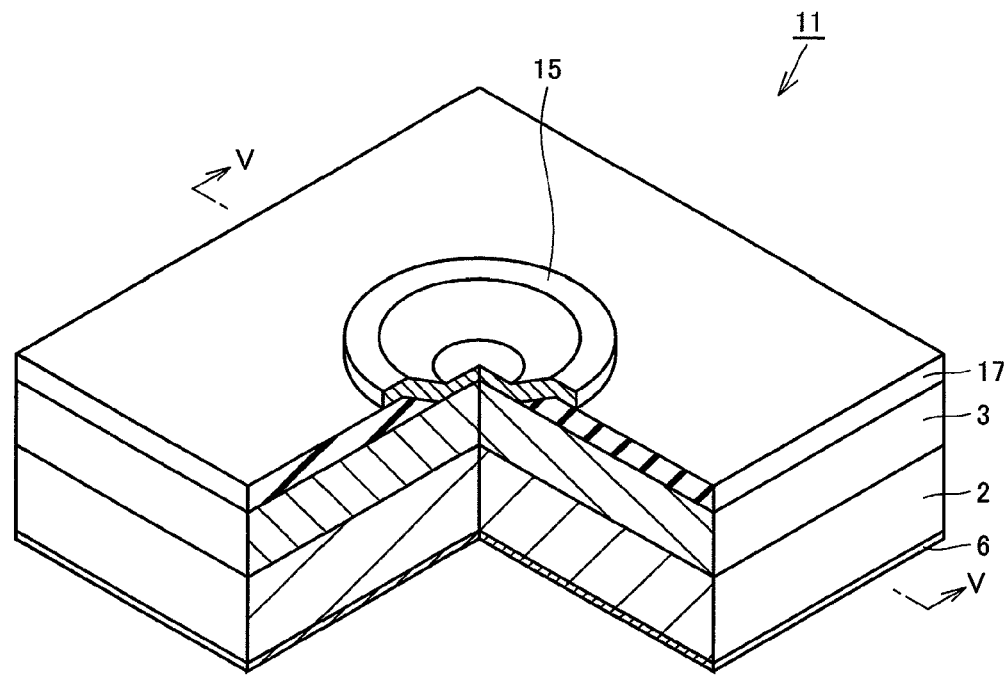
FIG. 6 is a perspective view schematically illustrating the Schottky barrier diode in the second embodiment of the present invention.

FIG. 5 is a cross-sectional view schematically illustrating a Schottky barrier diode in the present embodiment. FIG. 6 is a partial cutaway view schematically illustrating the Schottky barrier diode in the present embodiment. It is noted that FIG. 5 is a cross-sectional view taken along line V-V in FIG. 6. As shown in FIGS. 5 and 6, a Schottky barrier diode 11 in the present embodiment is different in that Schottky barrier diode 11 further includes a field plate (FP) electrode 16 and an insulating layer 17.

Specifically, insulating layer 17 is formed on front surface 3a of GaN layer 3 and has an opening in which Schottky electrode 4 is formed. Insulating layer 17 is configured by, for example, a silicon nitride film (SiN) and the like.

Field plate electrode 16 is formed to connect to Schottky electrode 4 located in the opening of this insulating layer 17 and to overlap this insulating layer 17. Field plate electrode 16 has, for example, a ring shape in a plane having a diameter of approximately 220 μm.

Field plate electrode 16 and Schottky electrode 4 configure an electrode 15. In other words, electrode 15 includes Schottky electrode 4 that is a portion in contact with front surface 3a of GaN layer 3 in the opening of insulating layer 17, and field plate electrode 16 that is a portion overlapping insulating layer 17.

Field plate electrode 16 and insulating layer 17 form a field plate structure. This field plate structure alleviates the electric field concentration, and thus, the withstand voltage of Schottky barrier diode 11 can be further enhanced. The field plate structure will be described hereinafter.

Insulating layer 17 preferably has a thickness t of 10 nm or more and 5 μm or less. When insulating layer 17 has thickness t of 10 nm or more, a decrease in durability of insulating layer 17 can be suppressed and the effect of the field plate structure can be offered without preceding destruction of insulating layer 17. On the other hand, when insulating layer 17 has thickness t of 5 μm or less, electric field alleviation by the field plate structure is obtained.

A field plate length L is desirably 1 μm or more and 1 mm or less. When field plate length L is 1 μm or more, the field plate structure is easily fabricated and the effect of the field plate structure is obtained with stability. On the other hand, when field plate length L is 1 mm or less, electric field alleviation by the field plate structure is obtained.

Field plate length L herein refers to a length of field plate electrode 16 overlapping insulating layer 17. In the present embodiment, field plate length L refers to a length along which field plate electrode 16 overlaps insulating layer 17 in a cross section including the center of electrode 15 of Schottky barrier diode 11 having a circular shape in a plane. In other words, when the opening of insulating layer 17 has a circular shape in a plane and Schottky electrode 4 that is a part of electrode 15 has a circular shape in a plane, field plate length L refers to a length along which field plate electrode 16 overlaps insulating layer 17 in a radial direction of electrode 15. To put it another way, field plate length L refers to a length along which field plate electrode 16 overlaps insulating layer 17 in a direction of a straight line connecting the center of gravity for the shape of Schottky electrode 4 in the plane and one particular point on the periphery of that shape.

Furthermore, as shown in FIG. 5, insulating layer 17 has an end face 17a facing the opening that is a portion where electrode 15 is in contact with GaN layer 3. End face 17a is inclined with respect to front surface 3a of GaN layer 3 to form an angle θ. Field plate electrode 16 that is a portion of electrode 15 overlapping insulating layer 17 overlaps insulating layer 17 to adhere to end face 17a.

Since end face 17a is inclined with respect to front surface 3a, the effect of electric field alleviation by the field plate structure can be increased. As a result, the withstand voltage of Schottky barrier diode 11 can be further enhanced. Such inclined end face 17a of insulating layer 17 can be formed by wet etching, dry etching and the like. End face 17a is formed such that angle θ is within the range of, for example, 0.1° or more and 60° or less. When the angle of inclination is 0.1° or more, the reproducibility of the angle is easily obtained. On the other hand, when the angle of inclination is 60° or less, the effect of electric field alleviation becomes strong.

Description of a method for manufacturing the Schottky barrier diode in the present embodiment will follow with reference to FIG. 7. It is noted that FIG. 7 is a flow chart illustrating the method for manufacturing the Schottky barrier diode in the present embodiment in the order of steps. The method for manufacturing the Schottky barrier diode in the present embodiment has a configuration basically similar to that of the first embodiment. The method for manufacturing the Schottky barrier diode in the present embodiment is, however, different in that the method for manufacturing the Schottky barrier diode in the present embodiment further includes an insulating layer formation step (S50), an insulating layer etching step (S60) and a field plate electrode formation step (S70).

Specifically, as shown in FIG. 7, the substrate preparation step (S10) and the GaN layer formation step (S20) are first performed as in the first embodiment.

Next, the insulating layer formation step (S50) is performed. In this insulating layer formation step (S50), insulating layer 17 having the opening is formed on GaN layer 3.

Specifically, insulating layer 17 made of $SiN_x$ is formed on GaN layer 3 by using, for example, plasma CVD (Chemical Vapor Deposition). Although a method for forming insulating layer 17 is not particularly limited, formation by using the plasma CVD method is preferable. In this case, insulating layer 17 is formed on GaN layer 3 by using the plasma CVD method, prior to the step of forming the metal layer. It is noted that in the step of forming insulating layer 17 by using the plasma CVD method, insulating layer 17 is formed at a temperature of, for example, 300° C. or more and 400° C. or less. In other words, GaN layer 3 is heat treated at 300° C. or more and 400° C. or less. In this case, the film quality of insulating layer 17 can be enhanced and the barrier height of the metal layer that will be formed in the metal layer formation step (S41) that will be described below can be enhanced. Therefore, the barrier height of Schottky electrode 4 can be enhanced.

Insulating layer 17 has film thickness t of, for example, approximately 1 μm. For example, $NH_3$, $SiH_4$ (monosilane), $NH_3$ (ammonia), $H_2$ (hydrogen), $N_2$ and the like are used as a material gas to form $SiN_x$. It is noted that when $SiN_x$ is formed from $SiH_4$ and $N_2$ without using $NH_3$, the concentration of hydrogen in insulating layer 17 can be decreased. Therefore, the use of $SiH_4$ and $N_2$ is preferable.

Next, the ohmic electrode formation step (S30) is performed as in the first embodiment.

Next, the insulating layer etching step (S60) is performed. In the insulating layer etching step (S60), a region of insulating layer 17 where Schottky electrode 4 will be formed and a region of insulating layer 17 where field plate electrode 16 will be formed are removed by etching.

Specifically, the resist having the opening is formed on insulating layer 17 by photolithography. Thereafter, insulating layer 17 exposed at the opening of the resist is subjected to wet etching with BHF (Buffered Hydrogen Fluoride). Thereafter, the resist is removed by organic cleaning and asher treatment in the atmosphere including oxygen and nitrogen. Insulating layer 17 is etched in such a manner to form the opening in insulating layer 17. At this point, GaN layer 3 is exposed at the opening. The opening can be formed such that the side surface thereof has a shape of a conical surface of a truncated cone having a maximum value of a diameter of, for example, 200 μm.

Next, the Schottky electrode formation step (S40) including the metal layer formation step (S41) and the heat treatment step (S42) is performed. It is noted that in the metal layer formation step (S41), the metal layer is formed in the opening of insulating layer 17 formed in the insulating layer etching step (S60), to be in contact with GaN layer 3.

Next, the field plate electrode formation step (S70) is performed. In the field plate electrode formation step (S70), field plate electrode 16 is formed to connect to Schottky electrode 4 and to overlap insulating layer 17.

Specifically, the field plate electrode formation step (S70) is performed by the following steps, for example. The resist having the opening is formed on a region other than a region in proximity to the opening of insulating layer 17 and on Schottky electrode 4. Next, an electrode material to serve as field plate electrode 16 is formed to connect to Schottky electrode 4 and to overlap insulating layer 17. Thereafter, when the resist is removed, the electrode material formed on the resist is removed (lift-off) simultaneously, and field plate electrode 16 can be formed.

Field plate electrode 16 may be formed of the same material as that of Schottky electrode 4. Alternatively, field plate electrode 16 may be formed of a material different from the material of Schottky electrode 4, such as a material having good adhesiveness to insulating layer 17.

By performing the above steps (S10 to S70), Schottky barrier diode 11 shown in FIGS. 5 and 6 can be manufactured.

Although the example where field plate electrode 16 is formed after Schottky electrode 4 is formed has been described in the above manufacturing method, Schottky electrode 4 and field plate electrode 16 may be formed simultaneously.

In this case, the following steps are performed, for example. The resist having the opening is formed, and the metal layer to serve as Schottky electrode 4 and the electrode material to serve as the field plate electrode are formed in this opening by using the vapor deposition method. Thereafter, when the resist is removed, the metal layer and the electrode material on the resist are removed (lift-off) simultaneously.

As a result, electrode 15 including Schottky electrode 4 that is a portion in contact with front surface 3a of GaN layer 3 in the opening of insulating layer 17 and field plate electrode 16 that is a portion connecting to Schottky electrode 4 and overlapping insulating layer 17 is formed. In other words, since the diameter of field plate electrode 16 is larger than the diameter of the opening formed in insulating layer 17, a part of electrode 15 overlaps insulating layer 17 and forms field plate electrode 16.

As described above, in the present embodiment, Schottky barrier diode 11 and the manufacturing method thereof further includes insulating layer 17 formed on GaN layer 3 and having the opening in which Schottky electrode 4 is formed, and field plate electrode 16 formed to connect to Schottky electrode 4 and to overlap insulating layer 17. Since GaN layer 3 is formed on GaN substrate 2, preparing GaN substrate 2 having low dislocation density allows formation of GaN layer 3 having low dislocation density. Therefore, the reverse leak current can be reduced. In Schottky barrier diode 11 having the field plate structure, the field plate structure remarkably alleviates the electric field under the condition that the reverse leak current decreases and under the condition that the heat-treated Schottky electrode of Ni or Ni alloy which can achieve high barrier height is used. As a result, the reverse leak current further decreases and the withstand voltage can be increased. This effect is remarkable when the region of GaN layer 3 in contact with Schottky electrode 4 has a dislocation density of $1 \times 10^8$ $cm^{-2}$ or less.

In addition, in the present embodiment, the method for manufacturing Schottky barrier diode 11 includes at least one of the step of heat treating GaN layer 3 (in the present embodiment, ohmic electrode formation step (S41)) and the step of forming insulating layer 17 on GaN layer 3 by using the plasma CVD method, prior to the metal layer formation step (S41). The inventors of the present invention have found, as a result of their earnest study, that the barrier height of the metal layer that will be subsequently formed can be enhanced by heat treating GaN layer 3 and by forming insulating layer 17 on GaN layer 3 by using the plasma CVD method before forming the metal layer to serve as Schottky electrode 4. Therefore, the withstand voltage of Schottky barrier diode 11 can be further enhanced. The reason for this will be described hereinafter.

When GaN layer 3 is heat treated (for example, 600° C. or less) before the metal layer formation step (S41), the surface state of GaN layer 3 changes due to the heat treatment. This is considered to cause the state of a Schottky interface to change in the heat treatment after the metal layer formation step (S41), which leads to an increase in barrier height. This is considered to cause the state of a Schottky interface to change in the heat treatment after the metal layer formation step (S41), which leads to an increase in barrier height.

When insulating layer 17 is formed on GaN layer 3 by using the plasma CVD method, front surface 3a of GaN layer 3 is exposed to plasma due to plasma CVD film formation and the surface state of GaN layer 3 changes. This is considered to cause the state of the Schottky interface to change in the heat treatment after the metal layer formation step (S41), which leads to an increase in barrier height.

Furthermore, in the heat treatment, drop and the like of N from front surface 3a of GaN layer 3 does not easily occur when insulating layer 17 is formed on GaN layer 3. This is considered to cause the state of the Schottky interface to change in the heat treatment after the metal layer formation step (S41), which leads to an increase in barrier height.

Accordingly, by including at least one of the step of heat treating GaN layer 3 and the step of forming insulating layer 17 on GaN layer 3 by using the plasma CVD method, prior to the metal layer formation step (S41), the barrier height of the metal layer can be significantly increased and the barrier height of Schottky electrode 4 can be significantly enhanced. In addition, by including both the step of heat treating GaN layer 3 and the step of forming insulating layer 17 on GaN layer 3 by using the plasma CVD method, the barrier height of Schottky electrode 4 can be enhanced more significantly. Therefore, inclusion of both steps is preferable.

Third Embodiment

FIG. 8 is a cross-sectional view schematically illustrating a Schottky barrier diode in the present embodiment. Referring to FIG. 8, a Schottky barrier diode 21 in the present embodiment has a configuration basically similar to that of Schottky barrier diode 11 in the second embodiment. Schottky barrier diode 21 in the present embodiment is different in that Schottky barrier diode 21 does not include the GaN substrate.

Specifically, Schottky barrier diode 21 includes a supporting substrate 23, a GaN underlying layer 22, GaN layer 3, electrode 15, insulating layer 17, and ohmic electrode 6. Region 3c of GaN layer 3 in contact with Schottky electrode 4 has a dislocation density of $1 \times 10^8$ $cm^{-2}$ or less, preferably $1 \times 10^7$ $cm^{-2}$ or less, and more preferably $1 \times 10^6$ $cm^{-2}$ or less.

Supporting substrate 23 is a conductive substrate. GaN underlying layer 22 is formed on this supporting substrate 23. GaN layer 3 is formed on this GaN underlying layer 22. It is noted that supporting substrate 23 is in ohmic contact with GaN underlying layer 22. In addition, when supporting substrate 23 is made of metal, ohmic electrode 6 does not need to be provided. The remaining configuration is similar to that of the second embodiment, and thus, description thereof will not be repeated.

Figure 9:
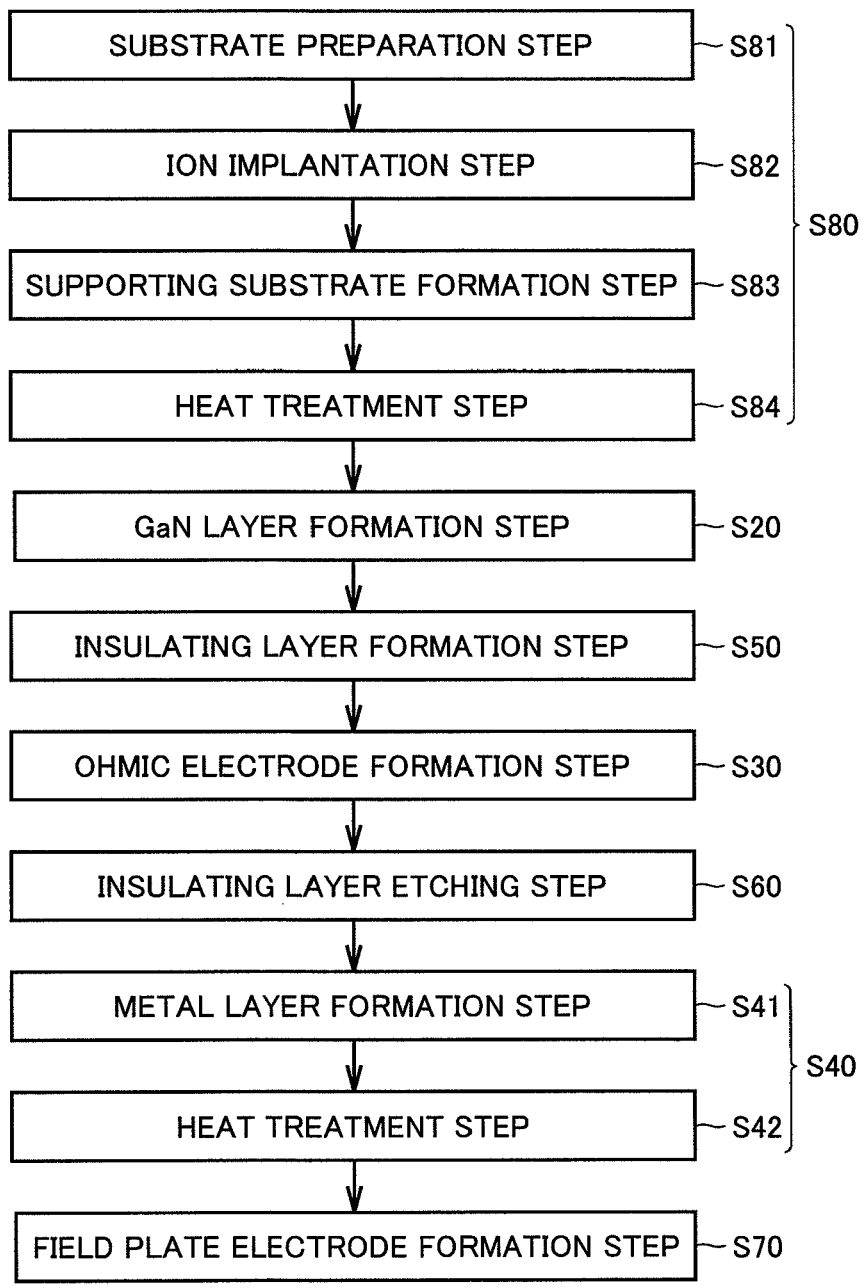
FIG. 9 is a flow chart illustrating a method for manufacturing the Schottky barrier diode in the third embodiment of the present invention in the order of steps.

Description of a method for manufacturing the Schottky barrier diode in the present embodiment will follow with reference to FIG. 9. It is noted that FIG. 9 is a flow chart illustrating the method for manufacturing the Schottky barrier diode in the present embodiment in the order of steps. The method for manufacturing the Schottky barrier diode in the present embodiment includes the configuration basically similar to that of the second embodiment. The method for manufacturing the Schottky barrier diode in the present embodiment is, however, different in that the method for manufacturing the Schottky barrier diode in the present embodiment includes a laminated substrate preparation step (S80) instead of the substrate preparation step (S10).

Specifically, GaN substrate 2 is prepared as in the substrate preparation step (S10) in the second embodiment (substrate preparation step (S81)). Next, in an ion implantation step (S82), impurities are ion-implanted from front surface 2a or rear surface 2b of GaN substrate 2. As a result, a layer including a large amount of impurities is formed in proximity to front surface 2a or rear surface 2b of GaN substrate 2. Next, in a supporting substrate formation step (S83), the ion-implanted surface and supporting substrate 23 are laminated together. Next, in a heat treatment step (S84), laminated GaN substrate 2 and supporting substrate 23 are heat treated. As a result, laminated GaN substrate 2 and supporting substrate 23 are divided with the region of GaN substrate 2 including the large amount of impurities being a boundary. As a result, a laminated substrate including supporting substrate 23 and GaN underlying layer 22 that is thinner than GaN substrate 2 and is formed on supporting substrate 23 can be created (laminated substrate preparation step (S80)). In this case, only a part of expensive GaN substrate 2 is used and the remaining portion is reusable, which allows reduction in manufacturing cost.

Next, in the GaN layer formation step (S20), GaN layer 3 is formed on GaN underlying layer 22. The region of this GaN layer 3 in contact with the Schottky electrode that will be described below has a dislocation density of $1 \times 10^8$ $cm^{-2}$ or less.

Next, the insulating layer formation step (S50), the ohmic electrode formation step (S30), the insulating layer etching step (S60), the Schottky electrode formation step (S40), and the field plate electrode formation step (S70) are performed as in the second embodiment.

By performing the above steps (S30 to S80), Schottky barrier diode 21 shown in FIG. 8 can be manufactured.

Although GaN underlying layer 22 is formed using GaN substrate 2, and further, GaN layer 3 is formed using GaN underlying layer 22 in the present embodiment, the method for manufacturing the Schottky barrier diode in the present embodiment is not particularly limited thereto.

In addition, although Schottky barrier diode 21 having the field plate structure has been described by way of example in the present embodiment, the Schottky barrier diode of the present invention does not need to have the field plate structure.

As described above, in Schottky barrier diode 21 and the manufacturing method thereof in the present embodiment, region 3c of GaN layer 3 in contact with Schottky electrode 4 has a dislocation density of $1\times10^8$ cm$^{-2}$ or less. The inventors of the present invention have found that the lower dislocation density region 3c of GaN layer 3 having Schottky junction has, the more reverse leak current can be reduced and the dislocation density of region 3c that allows effective reduction in reverse leak current is $1\times10^8$ cm$^{-2}$ or less. Therefore, the reverse leak current can be reduced. In addition, the inventors of the present invention have found that when Schottky electrode 4 having Schottky junction is made of Ni or Ni alloy, the barrier height can be effectively increased as a result of the heat treatment. Therefore, the barrier height of Schottky electrode 4 can be enhanced. Accordingly, since the reverse leak current caused by dislocation is small when Schottky barrier diode 21 is reversely biased, the withstand voltage of Schottky barrier diode 21 can be enhanced due to the increase in barrier height of Schottky electrode 4.

Example 1

Examples of the present invention will be described hereinafter. In the present example was examined how it is effective that the GaN layer formed on the GaN substrate is included and the Schottky electrode in contact with the GaN layer is made of Ni.

(Example 1 of the Present Invention)

A Schottky barrier diode in Example 1 of the present invention was manufactured in accordance with the method for manufacturing Schottky barrier diode 11 in the second embodiment as shown in FIGS. 5 and 6.

Specifically, in the substrate preparation step (S10), the n-type GaN freestanding substrate having the (0001) face as the main surface and fabricated by using the HVPE method was prepared. This GaN substrate had a dislocation density of $1\times10^6$ cm$^{-2}$ or less, a carrier concentration of $3\times10^{18}$ cm$^{-3}$ and a thickness of 400 μm.

Next, in the GaN layer formation step (S20), n-type GaN layer 3 was epitaxially grown on the GaN substrate by using the OMVPE method. This GaN layer 3 had a dislocation density of $1\times10^6$ cm$^{-2}$, a carrier concentration of $1\times10^{16}$ cm$^{-3}$ and a thickness of 5 μm.

It is noted that the above dislocation density was measured by using, for example, the method for counting the number of pits in the molten KOH created by etching, and dividing the number of pits by unit area.

Next, in the insulating layer formation step (S50), insulating layer 17 made of SiN$_x$ was formed by the plasma CVD. This insulating layer 17 had a thickness of 0.5 μm.

Next, in the ohmic electrode formation step (S30), the following steps were performed. First, rear surface 2b of GaN substrate 2 was organically cleaned and cleaned with hydrochloric acid. Thereafter, Ti having a thickness of 20 nm, Al having a thickness of 100 nm, Ti having a thickness of 20 nm, and Au having a thickness of 200 nm were stacked in this order on rear surface 2b of GaN substrate 2 by using the EB deposition method and the resistance heating deposition method. After this metal layer was formed, this metal layer was heat treated at 600° C. for two minutes in the atmosphere including nitrogen, and this metal layer was alloyed. As a result, ohmic electrode 6 was formed.

Next, in the insulating layer etching step (S60), the following steps were performed. First, patterning was performed on insulating layer 17 using photolithography. Thereafter, insulating layer 17 was subjected to wet etching with BHF. Then, the resist was removed by the organic cleaning treatment. As a result, insulating layer 17 was etched and the opening was formed in insulating layer 17. This opening was formed such that the side surface thereof had a shape of a conical surface of a truncated cone having a maximum value of a diameter of 200 μm.

Next, the Schottky electrode formation step (S40) and the field plate electrode formation step (S70) were performed simultaneously as follows. First, the resist having the opening was formed on insulating layer 17 using photolithography. Thereafter, the surface of GaN layer 3 and insulating layer 17 was cleaned with hydrochloric acid. Then, Ni having a thickness of 50 nm was formed on insulating layer 17 and at the position where Ni is in contact with GaN layer 3 (that is, the opening in insulating layer 17), by using the EB deposition method. Then, Au having a thickness of 300 nm was formed on Ni by using the resistance heating deposition method. Then, the resist was removed, and the metal layer having Ni and Au stacked on insulating layer 17 and at the position where Ni is in contact with GaN layer 3 was formed (S41).

Thereafter, the metal layer was heat treated at 450° C. for two minutes in the nitrogen atmosphere (S42). As a result, electrode 15 was formed, which includes Schottky electrode 4 having first layer 4a made of Ni, which is a portion in contact with front surface 3a of GaN layer 3 in the opening of insulating layer 17, and second layer 4b made of Au, as well as field plate electrode 16 that is a portion connecting to Schottky electrode 4 and overlapping insulating layer 17. Since the diameter of electrode 15 was larger than the diameter of the opening formed in insulating layer 17, field plate electrode 16 was formed with a part of electrode 15 overlapping insulating layer 17. As described above, the Schottky barrier diode in Example 1 of the present invention shown in FIG. 5 was manufactured.

Comparative Example 1

A method for manufacturing a Schottky barrier diode in Comparative Example 1 was different only in that the metal layer was not heat treated in the method for manufacturing the Schottky barrier diode in Example 1 of the present invention.

Comparative Example 2

Figure 10:
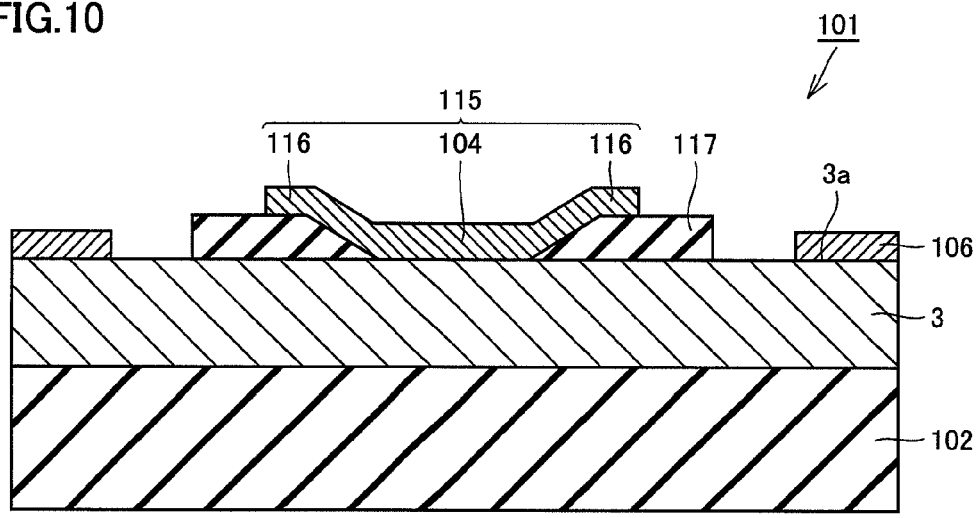
FIG. 10 is a cross-sectional view schematically illustrating a Schottky barrier diode in Comparative Example 2.

FIG. 10 is a cross-sectional view schematically illustrating a Schottky barrier diode in Comparative Example 2. As shown in FIG. 10, a Schottky barrier diode 101 in Comparative Example 2 was different in that a sapphire substrate 102 was used instead of the GaN substrate. When the sapphire substrate is used, a Schottky barrier diode having a vertical structure cannot be fabricated because sapphire substrate 102 is an insulator. Therefore, as shown in FIG. 10, Schottky barrier diode 101 having the horizontal field plate structure was fabricated.

A specific method for manufacturing Schottky barrier diode 101 shown in FIG. 10 is as follows.

First, as the substrate preparation step, sapphire substrate 102 was prepared.

Next, as the GaN layer formation step, n-type GaN layer 3 having a carrier density of $1\times10^{16}$ cm$^{-3}$ and a thickness of 5 µm was grown on sapphire substrate 102 by using the HVPE method. At this time, GaN layer 3 shown in FIG. 10 had a dislocation density of $1\times10^9$ cm$^{-2}$.

Next, in the insulating layer formation step, an insulating layer 117 that will form the field plate structure was formed on a region of front surface 3a of GaN layer 3 other than a region on the peripheral side. The conditions for forming insulating layer 117 were similar to those in Example 1 of the present invention.

Next, in the ohmic electrode formation step, the following steps were performed. The resist having the opening was formed on insulating layer 117 by photolithography. Thereafter, as in Example 1 of the present invention, organic cleaning and cleaning with hydrochloric acid were performed and a metal layer similar to that in Example 1 of the present invention was formed on front surface 3a of GaN layer 3. Thereafter, when the resist was removed, lift-off for simultaneously removing the electrode material formed on the resist was performed. Thereafter, as in Example 1 of the present invention, the metal layer was alloyed and an ohmic electrode 106 was formed.

Next, the insulating layer etching step was performed as in Example 1 of the present invention to form the opening in insulating layer 117.

Next, the Schottky electrode formation step and the field plate electrode formation step were performed as in Example 1 of the present invention. As a result, an electrode 115 was formed, which includes a Schottky electrode 104 that is a portion in contact with front surface 3a of GaN layer 3 in the opening of insulating layer 117, and a field plate electrode 116 that is a portion connecting to Schottky electrode 104 and overlapping insulating layer 117.

Comparative Example 3

A method for manufacturing a Schottky barrier diode in Comparative Example 3 was different only in that the metal layer was not heat treated in the method for manufacturing the Schottky barrier diode in Comparative Example 2.

Comparative Example 4

A method for manufacturing a Schottky barrier diode in Comparative Example 4 was different only in that a GaN substrate having a dislocation density of $1\times10^7$ cm$^{-2}$ was used in the method for manufacturing the Schottky barrier diode in Comparative Example 1. Therefore, a GaN layer in Comparative Example 4 had a dislocation density of $1\times10^7$ cm$^{-2}$.

(Measurement Method)

Figure 12:
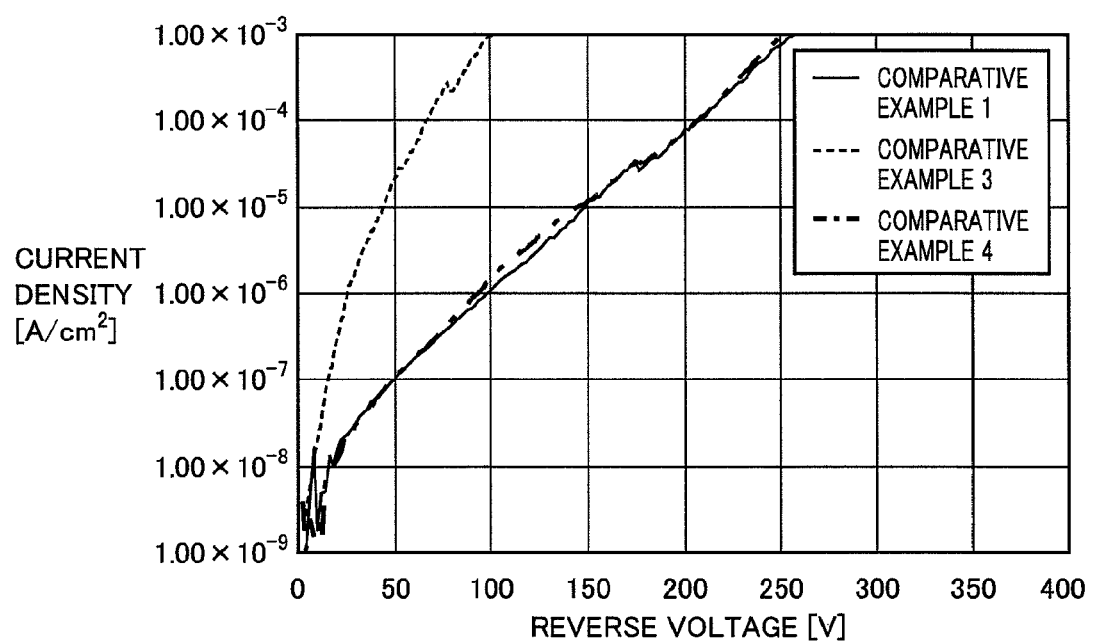
FIG. 12 illustrates a relationship between the reverse voltage and the current density in Example 1.

The withstand voltage when a reverse bias was applied was measured for the Schottky barrier diode in each of Example 1 of the present invention and Comparative Examples 1 to 4. The reverse withstand voltage was measured by a method employing a high withstand voltage probe to measure the current and the voltage with the Schottky barrier diode immersed in fluorine-based inactive liquid. The withstand voltage of the Schottky barrier diode in each of Example 1 of the present invention and Comparative Examples 1 to 4 was set as a voltage having a current density of 1 mA/cm$^2$. The result is shown in the following Table 1 and FIG. 12. It is noted that FIG. 12 illustrates a relationship between the voltage (reverse voltage) and the current (current density) in Comparative Examples 1, 3 and 4 in which the heat treatment was not performed after the metal layer formation. In FIG. 12, the horizontal axis indicates the reverse voltage (unit: V) and the vertical axis indicates the current density (unit: A/cm).

TABLE 1

| | With or Without Heat Treatment | Substrate | Dislocation Density (cm$^{-2}$) | Withstand Voltage |
|---|---|---|---|---|
| Example 1 of the Present Invention | with | GaN | $1\times10^6$ | 605 V |
| Comparative Example 1 | without | GaN | $1\times10^6$ | 256 V |
| Comparative Example 2 | with | Sapphire | $1\times10^9$ | 130 V |
| Comparative Example 3 | without | Sapphire | $1\times10^9$ | 100 V |
| Comparative Example 4 | without | GaN | $1\times10^7$ | 250 V |

(Measurement Result)

As shown in Table 1, the withstand voltage of the Schottky barrier diode in Example 1 of the present invention obtained by forming the GaN layer on the GaN substrate and heat treating the metal layer was 605V, which was very high.

In addition, the withstand voltage of the Schottky barrier diode in Comparative Example 1 in which the heat treatment step (S42) was not performed was lower than that of the Schottky barrier diode in Example 1 of the present invention. This showed that by performing the heat treatment step (S42), the barrier height of Schottky electrode 4 can be increased, and thus, the withstand voltage can be enhanced.

Furthermore, in Comparative Examples 2 and 3, GaN layer 3 was formed on the sapphire substrate, and thus, GaN layer 3 had a high dislocation density. Therefore, the reverse leak current increased and the withstand voltage was low. This showed that by forming GaN layer 3 on GaN substrate 2 to reduce the dislocation density of the region of GaN layer 3 in contact with the Schottky electrode to $1\times10^6$ cm$^{-2}$, the reverse leak current can be reduced, and thus, the withstand voltage can be enhanced.

In addition, in the Schottky barrier diode in Example 1 of the present invention including GaN layer 3 having a low dislocation density, the withstand voltage was able to be enhanced by 475V as compared with the Schottky barrier diode in Comparative Example 2 including the GaN layer having a high dislocation density. This showed that by reducing the dislocation density, the reverse leak current can be decreased, and thus, the withstand voltage can be enhanced.

Furthermore, in Comparative Example 1 in which the heat treatment was not performed and the GaN layer having a low dislocation density was included, the withstand voltage was able to be enhanced by 156V as compared with Comparative Example 3 in which the heat treatment was not performed and the GaN layer having a high dislocation density was included. This showed that by performing the heat treatment and reducing the dislocation density, the withstand voltage can be enhanced and an increase in reverse leak current caused by the dislocation density of GaN layer 3 is a predominant factor for the withstand voltage.

Comparing Comparative Example 2 in which the heat treatment step was performed and Comparative Example 3 in which the heat treatment step was not performed, the withstand voltage that was able to be enhanced by performing the heat treatment was 30V. On the other hand, comparing Example 1 of the present invention in which the heat treatment step (S42) was performed and Comparative Example 1 in which the heat treatment step was not performed, the withstand voltage that was able to be enhanced by performing the heat treatment step (S42) was 349V. This showed that by increasing the barrier height of the Schottky electrode by the heat treatment step (S42) and reducing the dislocation density of GaN layer 3, the withstand voltage can be significantly enhanced.

In addition, as shown in FIG. 12, as for Comparative Example 1 in which GaN substrate 2 and GaN layer 3 had a dislocation density of $1 \times 10^6$ cm$^{-2}$ and Comparative Example 4 in which GaN substrate 2 and GaN layer 3 had a dislocation density of $1 \times 10^7$ cm$^{-2}$, the relationship between the current density and the reverse voltage was almost the same and the withstand voltage was also at the same level. On the other hand, as for Comparative Example 4 in which GaN substrate 2 and GaN layer 3 had a dislocation density of $1 \times 10^7$ cm$^{-2}$, the relationship between the current density and the reverse voltage differed widely and the withstand voltage was also enhanced, as compared with Comparative Example 3 in which GaN substrate 2 and GaN layer 3 had a dislocation density of $1 \times 10^9$ cm$^{-2}$. This result showed that by reducing the dislocation density of GaN layer 3 to $1 \times 10^7$ cm$^{-2}$ or less, the reverse leak current can be effectively decreased when the Schottky barrier diode is reversely biased.

Based on the result that the withstand voltage was able to be enhanced more significantly in Example 1 of the present invention in which the metal layer in Comparative Example 1 was heat treated, than in Comparative Example 1, as well as the result that the withstand voltage was at the same level in Comparative Example 1 and Comparative Example 4, it is considered that the example of the present invention in which the metal layer in Comparative Example 4 was heat treated can achieve the withstand voltage as high as the withstand voltage in Example 1 of the present invention.

As described above, according to the present example, it was confirmed that since the GaN layer formed on the GaN substrate is included and the Schottky electrode in contact with the GaN layer is made of Ni, the reverse leak current can be reduced and the barrier height of the Schottky electrode can be increased, and thus, the withstand voltage can be enhanced. It can be estimated that the Schottky electrode made of Ni alloy has the effect similar to the effect produced when the Schottky electrode is made of Ni.

Example 2

In the present example was examined how it is effective that the barrier height can be increased due to the Schottky electrode made of Ni.

(Samples 1 to 4)

Schottky barrier diodes of Samples 1 to 4 were manufactured similarly to the

Schottky barrier diode in Example 1 of the present invention. The Schottky barrier diodes of Samples 1 to 4 were, however, different only in terms of the metal layer formation step (S41) and the heat treatment step (S42). Specifically, in the metal layer formation step (S41), Ni having a thickness of 25 nm was formed, and then, Au having a thickness of 300 nm was formed on Ni. In addition, in the heat treatment step (S42) for Samples 1 to 4, the heat treatment temperature was set to 300° C., 400° C., 500° C., and 550° C., respectively. In addition, the heat treatment time was set to one minute.

(Samples 5 to 8)

Schottky barrier diodes of Samples 5 to 8 were different from Samples 1 to 4 only in that Pt (platinum) was formed as the first metal layer and Au was formed on this first metal layer as the second metal layer, and in that the heat treatment temperature in the heat treatment step (S42) was set to 300° C., 400° C., 500° C., and 600° C.

(Sample 9)

A Schottky barrier diode of Sample 9 was different only in that the thickness of Ni as the first metal layer was set to 25 nm in Comparative Example 2. In other words, the heat treatment step (S42) was not performed in a method for manufacturing Samples 1 to 4.

(Sample 10)

As for a Schottky barrier diode of Sample 10, the heat treatment step (S42) was not performed in a method for manufacturing Samples 5 to 8.

(Measurement Method)

Figure 11:
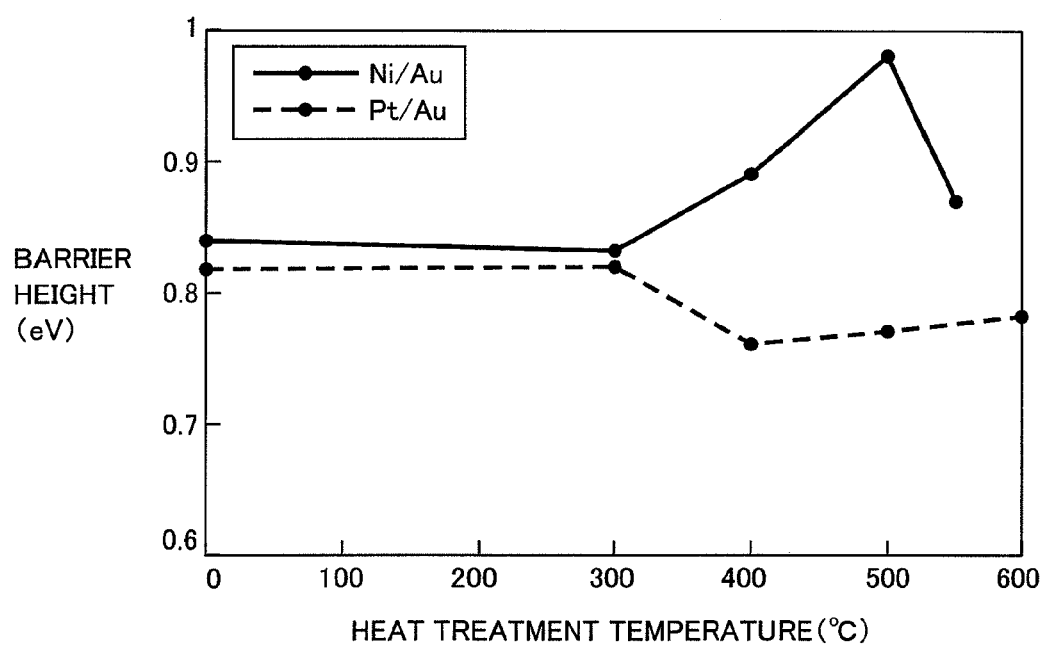
FIG. 11 illustrates a relationship between the heat treatment temperature and the barrier height in Example 2.

The barrier height of the Schottky electrodes of the Schottky barrier diodes of Samples 1 to 10 was measured. A method for measuring the barrier height was derived from the I-V property in the forward direction. The result is shown in FIG. 11. It is noted that FIG. 11 illustrates a relationship between the heat treatment temperature and the barrier height in the present example. In FIG. 11, the horizontal axis indicates the temperature (unit: ° C.) at which the metal layer was heat treated in the heat treatment step (S41), and the vertical axis indicates the barrier height (unit: eV).

(Measurement Result)

As shown in FIG. 11, in Samples 1 to 4 including the Schottky electrode having the first layer made of Ni, the barrier height was able to be increased by performing the heat treatment step (S42), as compared with Samples 5 to 8 including the Schottky electrode having the first layer made of Pt.

In addition, in Samples 1 to 4 including the Schottky electrode having the first layer made of Ni, the barrier height was able to be greatly increased as a result of heat treatment at 400° C. or more and 550° C. or less.

It is noted that since the heat treatment time in the heat treatment step (S41) was set to one minute in the present example, the effect was not sufficiently obtained at 300° C. The inventors of the present invention, however, have findings that the barrier height can be enhanced by setting the heat treatment time to a prolonged time exceeding one minute. Therefore, the barrier height of Schottky electrode 4 can be increased by heat treatment at 300° C. or more and 600° C. or less. In other words, when the heat treatment is performed at 400° C. or more and 550° C. or less, the Schottky barrier height of Schottky electrode 4 can be increased with stability in a short time, which leads to the excellent manufacturing efficiency. In addition, when the heat treatment is performed at 400° C. or more and 550° C. or less, more time can be spent in the heat treatment, as compared with the case where the heat treatment is performed at a temperature exceeding 550° C. and a temperature of 600° C. or less. Therefore, the properties of Schottky electrode 4 can be further stabilized.

As described above, according to the present example, it was able to be confirmed that when the Schottky electrode is made of Ni, the barrier height of the Schottky electrode can be increased as a result of the heat treatment.

Although the embodiments and examples of the present invention have been described above, combination as appropriate of features in each embodiment and example is originally encompassed. In addition, it should be understood that the embodiments and examples disclosed herein are illustrative and not limitative in any respect. The scope of the present invention is defined by the terms of the claims, rather than the above embodiments, and is intended to include any modifications within the scope and meaning equivalent to the terms of the claims.

DESCRIPTION OF THE REFERENCE SIGNS 1, 11, 21 Schottky barrier diode; 2 GaN substrate; 2a, 3a front surface; 2b rear surface; 3 GaN layer; 3c region; 4

Schottky electrode; 4a first layer; 4b second layer; 6 ohmic electrode; 15 electrode; 16 field plate electrode; 17 insulating layer; 17a end face; 22 underlying layer; 23 supporting substrate; L field plate length; t film thickness; θ angle

The invention claimed is:

1. A Schottky barrier diode, comprising:
    a GaN layer;
    a Schottky electrode formed on said GaN layer; and
    a support substrate supporting said GaN layer, wherein
    a region of said GaN layer directly in contact with said Schottky electrode has a dislocation density of $1\times10^8$ cm$^{-2}$ or less, and
    said Schottky electrode includes a first layer made of Ni or Ni alloy and formed at a position where the first layer is in contact with said GaN layer.

2. The Schottky barrier diode according to claim 1, wherein said Schottky electrode further includes a second layer including Au and formed on said first layer.

3. The Schottky barrier diode according to claim 1, further comprising:
    an insulating layer formed on said GaN layer and having an opening in which said Schottky electrode is formed; and
    a field plate electrode formed to connect to said Schottky electrode and to overlap said insulating layer.

4. The Schottky barrier diode according to claim 1, further comprising an ohmic electrode formed on a rear surface of the support substrate.

5. A method for manufacturing a Schottky barrier diode, comprising the steps of:
    preparing a support substrate;
    preparing a GaN layer; and
    forming a Schottky electrode including a first layer made of Ni or Ni alloy and in contact with said GaN layer, wherein
    in said step of preparing a GaN layer, said GaN layer is formed on said support substrate,
    said step of preparing a GaN layer includes a step of preparing said GaN layer whose region directly in contact with said Schottky electrode has a dislocation density of $1\times10^8$ cm$^{-2}$ or less, and
    said step of forming a Schottky electrode includes a step of forming a metal layer to serve as said Schottky electrode and a step of heat treating said metal layer to form said metal layer into said Schottky electrode including said first layer.

6. The method for manufacturing a Schottky barrier diode according to claim 5, wherein
    in said step of heat treating said metal layer, said metal layer is heat treated at a temperature of 300° C. or more and 600° C. or less.

7. The method for manufacturing a Schottky barrier diode according to claim 6, wherein
    in said step of heat treating said metal layer, said metal layer is heat treated at a temperature of 400° C. or more and 550° C. or less.

8. The method for manufacturing a Schottky barrier diode according to claim 5, wherein
    said step of forming a metal layer and said step of heat treating said metal layer are performed in parallel.

9. The method for manufacturing a Schottky barrier diode according to claim 8, wherein
    in said step of heat treating said metal layer, said metal layer is heat treated at a temperature of 200° C. or more and 600° C. or less.

10. The method for manufacturing a Schottky barrier diode according to claim 5, wherein
    in said step of heat treating said metal layer, said metal layer is heat treated in an atmosphere including nitrogen.

11. The method for manufacturing a Schottky barrier diode according to claim 5, wherein
    said step of forming a Schottky electrode further includes a step of forming a second layer including Au on said first layer.

12. The method for manufacturing a Schottky barrier diode according to claim 5, further comprising the steps of:
    forming an insulating layer having an opening on said GaN layer; and
    forming a field plate electrode to connect to said Schottky electrode and to overlap said insulating layer, wherein
    in said step of forming a metal layer, said metal layer is formed in said opening of said insulating layer to be in contact with said GaN layer.

13. The method for manufacturing a Schottky barrier diode according to claim 5, further comprising
    at least one of a step of heat treating said GaN layer and a step of forming an insulating layer on said GaN layer by using a plasma CVD method, prior to said step of forming a metal layer.

14. The method for manufacturing a Schottky barrier diode according to claim 5, further comprising a step of forming an ohmic electrode on a rear surface of the support substrate.

* * * * *